United States Patent [19]

Nojima et al.

[11] Patent Number: 5,262,026

[45] Date of Patent: Nov. 16, 1993

[54] METHOD OF MANUFACTURING A DEVICE HAVING A SUPERCONDUCTING FILM

[75] Inventors: Hideo Nojima; Masayoshi Koba; Masaya Nagata; Hidetaka Shintaku, all of Nara, Japan

[73] Assignee: Sharp Kabushiki Kaisha, Osaka, Japan

[21] Appl. No.: 908,922

[22] Filed: Jul. 2, 1992

Related U.S. Application Data

[63] Continuation of Ser. No. 603,617, Oct. 26, 1990, abandoned.

[30] Foreign Application Priority Data

Oct. 27, 1989 [JP]  Japan .................... 1-280349
Jan. 9, 1990 [JP]   Japan .................... 2-3191
May 29, 1990 [JP]   Japan .................... 2-140655
May 31, 1990 [JP]   Japan .................... 2-145085

[51] Int. Cl.$^5$ .................... C25D 13/02; B05D 5/12
[52] U.S. Cl. .................... 204/181.5; 204/181.4; 204/181.7; 505/741; 427/62; 427/63
[58] Field of Search .............. 204/181.4, 181.5, 181.7; 505/741; 427/62, 63

[56] References Cited

U.S. PATENT DOCUMENTS

| | | | |
|---|---|---|---|
| 4,870,051 | 9/1989 | Maxfield et al. | 204/58.5 X |
| 4,939,119 | 7/1990 | Iwata et al. | 505/1 |
| 4,952,557 | 8/1990 | Schmidt | 505/1 |
| 4,975,417 | 12/1990 | Koura | 505/1 |
| 5,011,818 | 4/1991 | Katoka et al. | |

FOREIGN PATENT DOCUMENTS

| | | | |
|---|---|---|---|
| 289412 | 11/1988 | European Pat. Off. | |
| 316143 | 5/1989 | European Pat. Off. | |
| 350143 | 1/1990 | European Pat. Off. | |
| 0169816 | 7/1989 | Japan | 505/741 |
| 2130968 | 5/1990 | Japan | 505/741 |

OTHER PUBLICATIONS

Era, Masanori; Noge, Satoru; Yamashita, Tsutomui & Takata, Masasuke, "New Techniques for Device Fabrications of High-Transition Temperature Superconducting Thin-Films" Nippon Seramikkusu Kyokai Gakujustsu Ronbunshi 97 (10), pp. 1058-1064.

(List continued on next page.)

Primary Examiner—John Niebling
Assistant Examiner—John S. Starsiak, Jr.

[57] ABSTRACT

In a method for manufacturing a device having a film of high temperature superconductor, a copper substrate is used in the electrophoretic deposition as a cathode on which fine powders of superconductor should be deposited, and the fine powders deposited on the substrate are fired in the conditions that they are sintered partially.

In other methods for manufacturing such a device, a desired minute pattern of electrically conductive material as a cathode in the electrophoretic deposition is formed on a substrate, and a minute pattern of fine powders is deposited according to the pattern of the cathode. Then, the fine powders are fired to form a superconductor film. Such a desired pattern of the cathode is formed by the patterning of a film of an electrically insulating substrate. Such a desired pattern of the cathode is also formed by the patterning of an electrically insulating material, applied to an electrically conductive substrate.

In a further method for manufacturing such a device, a desired minute pattern of electrically conductive material as a cathode in the electrophoretic deposition is formed on a substrate, while another pattern of electrically conductive material as an anode is formed on the same substrate near the former pattern so as to keep a constant distance. The fine powders deposited on the former pattern are fired to form a superconductor film.

25 Claims, 12 Drawing Sheets

OTHER PUBLICATIONS

Chemical Abstract 112(4):28890v, Era, Masanori; Noge, Satoru; Yamashita, Tsutomu; Takata, Masasuke "New Techniques for Device Fabrications of High--Transistor Temperature Superconducting Thin-Films" *Nippon Seramikkusu Kyokai Gakujutsu Ronbumshi,* 97 (10) pp. 1058–1064.

C. T. Chu and B. Dunn "Fabrication of $\gamma Ba_2Cu_3O_{7-y}$ Superconducting Coatings by Electrophoretic Deposition" Appl. Phys. Lett. 55(5), 31 Jul. 1989, pp. 492–494.

Nobuyu Kikoura "Preparation of Various Shape Superconducting Ceramics Using the Electrophoretic Deposition Method" Denki Kagaku, 56 (3) pp. 208–209.

Preparation of Various Shape Superconducting Ceramics Using the Electrophoretic Deposition Method, Nobuyuki Koura, Feb. 10, 1988.

Fabrication of $YBa_2CU_3O_{7-y}$ superconducting coatins by electrophoretic deposition, by C. T. Chu and B. Dunn; Jun. 5, 1989.

Highly Sensitive Magnetic Sensor Using $Y_1Ba_2Cu_3O_{7-x}$ Films, R. Kita, et al. 5th Fed. HiTsSc-Ed Workshop, Jun. 2–4, 1988, pp. 231–234.

Galvanomagnetic Effect of an Y–Ba–Cu–O Ceramic Superconductor and Its Application to Magnetic Sensors, H. Nojima, et al. Pub. Feb. 27, 1988.

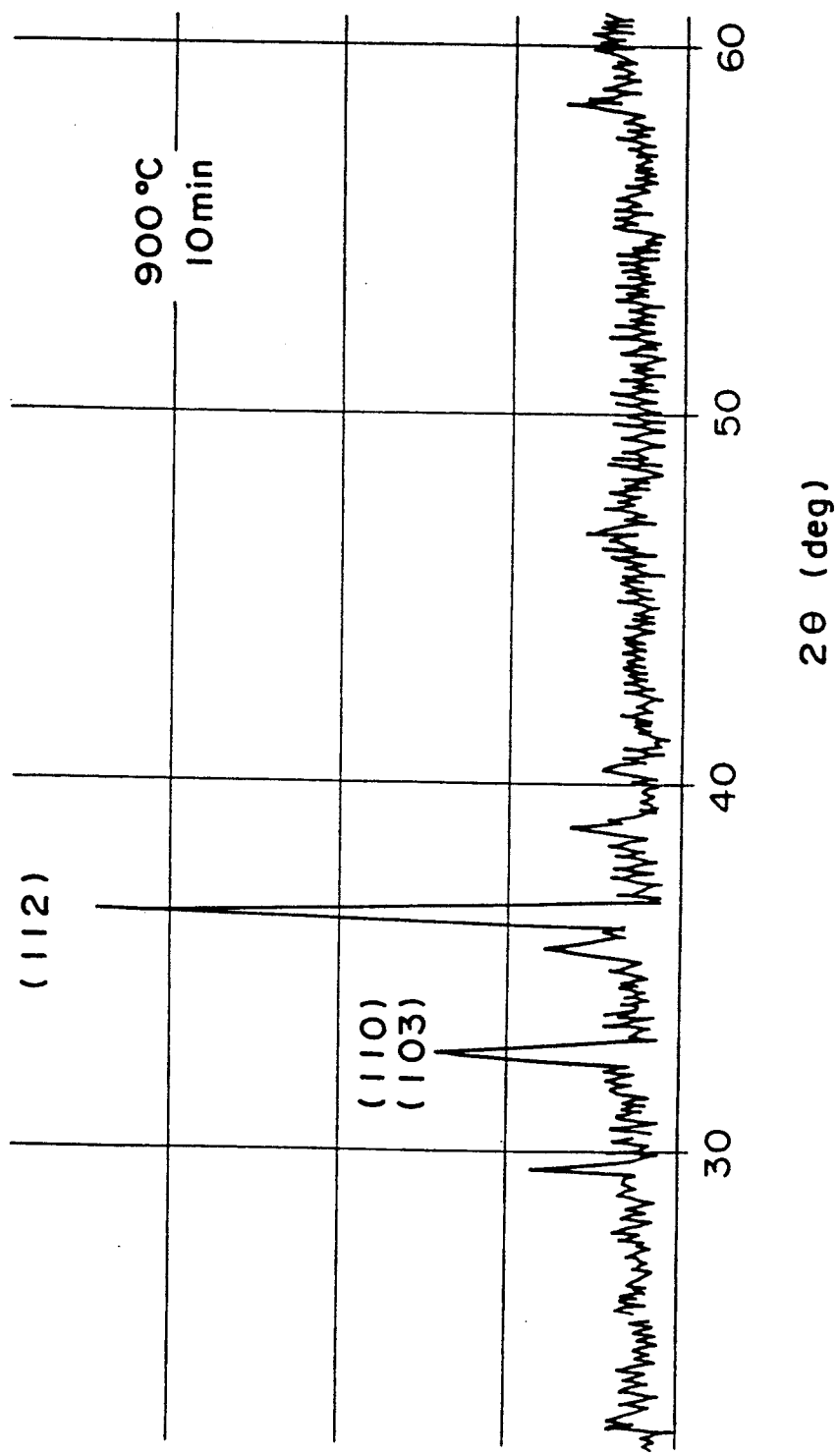

METHOD OF MANUFACTURING A DEVICE HAVING A SUPERCONDUCTING FILM

This application is a continuation of application Ser. No. 07/603,617, filed on Oct. 26, 1990, now abandoned.

FIELD OF THE INVENTION

The present invention relates to a manufacturing method for a superconducting film by using an electrophoretic deposition process.

BACKGROUND OF THE INVENTION

After the discovery of high-temperature oxide (ceramic) superconductors which become superconducting above liquid nitrogen temperature (77 K), fundamental and application researches have been developed actively.

One of the most important problems to be solved in the application research of high temperature oxide superconductors is to make sure the manufacturing technique of a superconducting film of desired grain boundary characteristics of a predetermined pattern precisely.

Many techniques such as sputtering, vacuum deposition (reactive deposition, MBE, ICB, laser deposition or the like), MO-CVD, spray pyrolysis, screen printing and sol gel have been used to prepare a superconductor film. These techniques have their respective characteristics. For example, sputtering, vacuum deposition and MO-CVD can be used to manufacture a monocrystalline or quasi-monocrystalline thin film. Thus, they can produce a thin film of high quality so that they can be used to manufacture an electronic device including a high temperature superconductor instead of a metallic superconductor which has been used before. However, the area of a film manufactured by these techniques is small. Further, a vacuum pump is needed and an apparatus for these techniques becomes on a large scale. On the other hand, techniques such as spray pyrolysis, screen printing and sol gel are not suitable to produce a monocrystalline thin film, but they can be used widely for applications with use of polycrystalline material such as a non-resistance printing circuit board, a magnetic shield, a wire and a sensor. However, these techniques are based on complicated chemical processes for forming a film, so that they are not good as to the reproducibility or reliability. Thus, they cannot be used to produce a device such as a magnetic sensor, a photosensor or a logic device which makes use of the weak-coupling at crystal grain boundaries. Further, with these techniques it is hard to produce a film of a complicated pattern of wide area on a board.

Especially, high temperature superconductors have a short coherence length and a small carrier concentration. Therefore, they have a characteristic that crystal grains are easy to be coupled weakly to each other at grain boundaries, like a Josephson junction. By using this effect, a wide range of applications will be expected to be developed. For example, a device such as a magnetic sensor (see, for example, H. Najima et al., Jpn. J. Appl. Phys. 27 (1988) 746, a photosensor, or a logic device can be realized. Unfortunately, a film of high temperature superconductor has generally grain boundaries of porous structure, so that it is difficult to make a film of a predetermined pattern by using a general photoetching process. That is, in the photoetching processing, a resist or an etchant penetrates the film through grain boundaries, so that the patterning of the film may not be performed precisely. Thus, a device which makes use of grain boundary characteristics of high temperature superconductor is difficult to be manufactured so as to have a minute pattern.

Recently, a fundamental technique which makes use of electrophoresis to form a superconducting film was reported (for example, N. Koura, Denki Kagaku 56, 208 (1988), and C. T. Chu and B. Dunn, Appl. Phys. Lett. 55, 492 (1989)).

In this electrophoretic deposition technique, fine powders of superconducting material, which have been dispersed in an organic solvent, are deposited on a substrate kept at a negative electric voltage against a counter electrode, and the deposited film is sintered with the use of heat treatment to form a superconducting film.

A superconducting film manufactured by using the electrophoretic deposition technique has many superior potentials on the application of high temperature superconductors. However, there are many unknown points in the mechanism, and the guidelines to control the characteristics of a film are insufficient. That is, there remain many problems to be solved.

Further, an electrode such as a precious silver plate was used as an electrically conductive substrate on which fine powders of oxide superconductor are deposited. However, silver is expensive. Therefore, a less expensive material is desirable.

Still further, as mentioned above, a superconducting film manufactured by using electrophoretic deposition techniques was also difficult to be processed to have a desired pattern by using the photoetching technique because it has porous grain boundaries. Therefore, it was impossible to design a device having a minute pattern so as to make use of grain boundary characteristics of high temperature superconductors. It is desirable that a film is composed of crystal grains of similar size and similar grain boundary characteristics to each other.

SUMMARY OF THE INVENTION

It is accordingly an object of the present invention to provide a new method of manufacturing a superconducting film which has a precise minute pattern to be desired by using electrophoresis.

It is another object of the present invention to provide a new method of manufacturing a superconducting thin film which has desired crystal grain boundary characteristics.

A first method according to the present invention for manufacturing a superconducting film including the steps as follows. Providing a metal plate to which a superconducting film is to be dispersing fine powders of a superconducting material in an organic solvent to form a dispersion solution. Immersing the metal plate and an electrode in the dispersion solution. Applying an electric voltage between the metal plate and the electrode so as to keep the electric potential of the metal plate negative compared with that of the electrode, whereby fine powders in the dispersion solution are deposited on the pattern. Firing the fine powders deposited on the copper plate in the conditions that the fine powders are sintered partially.

A second method according to the present invention for manufacturing a superconducting film following the steps. Applying a film of electrically conductive material to an electrically insulating substrate. Forming a pattern of the film. Dispersing fine powders of a superconducting material in an organic solvent to form a dispersion solution. Immersing the substrate and a counter electrode in the dispersion solution. Applying an electric voltage between the pattern of the film applied to the substrate and the counter electrode so as to keep the electric potential of the patter negative compared with that of the counter electrode, whereby fine powders in the dispersion solution are deposited on the pattern. Firing the fine powders deposited on the pattern.

A third method according to the present invention for manufacturing a superconducting film comprises the following steps. Applying a film of electrically insulating material to an electrically conductive substrate. Forming a pattern of the film; dispersing fine powders of a superconducting material in an organic solvent to form a dispersion solution. Immersing the substrate and a counter electrode in the dispersion solution. Applying an electric voltage between the substrate and the counter electrode so as to keep the electric potential of the substrate negative compared with that of the counter electrode, whereby fine powders in the dispersion solution are deposited on the predetermined surface area of the electrode not covered by the electrically insulating material. Firing the fine powders deposited on the surface area.

A fourth method according to the present invention for manufacturing a superconducting film comprises the following steps of: forming a first pattern and a second pattern both of a film of electrically conductive material applied to an electrically insulating substrate, the first pattern having a shape of superconducting film to be manufactured and, the second pattern being formed near the first pattern with a constant distance. Dispersing fine powders of a superconducting material in an organic solvent to form a dispersion solution. Immersing the substrate in the dispersion solution and applying an electric voltage between the two patterns on the substrate so as to keep the electric potential of the first pattern negative compared with that of the second pattern, whereby fine powders in the dispersion solution are deposited on the first pattern. Firing the fine powders deposited on the first pattern.

It is an advantage of the present invention, that a film of oxide superconductor can be manufactured easily to have a minute pattern and to have grain boundary characteristics.

BRIEF DESCRIPTION OF THE DRAWINGS

Further objects and advantages of the present invention will be apparent from the following description. Reference being made to the accompanying drawings, wherein preferred embodiments of the present invention are clearly shown.

FIG. 4 is an X-ray diffraction spectra of an oxide superconductor according to Example 1.

EMBODIMENTS

Figure 1:
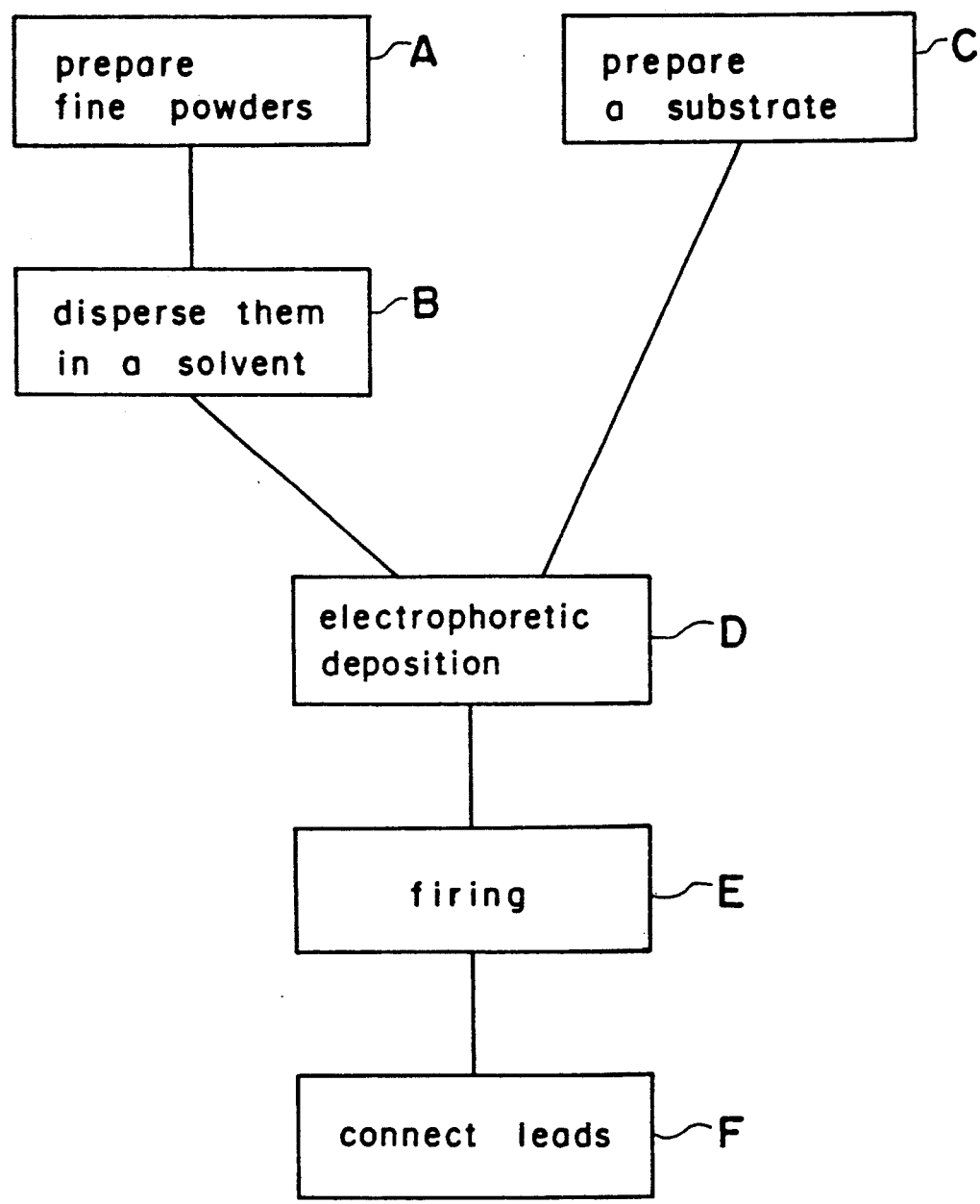
FIG. 1 is a flow chart of a method of manufacturing a device having a superconducting film.

Referring now to the drawings, wherein like reference characters designate like or corresponding parts throughout the several views, embodiments of the present invention will be explained in detail.

A device (a highly sensitive magnetic sensor) having a superconductor film is manufactured by using the electrophoretic deposition technique in the steps as shown in FIG. 1. First, fine powders of oxide superconductor is prepared (Step A), and they are dispersed in an organic solvent to form a dispersion solution (Step B). On the other hand, a substrate having or made of an electrically conductive material as a cathode is prepared (Step C). Then, the substrate is immersed in the dispersion solution, and the electrophoretic deposition is performed (Step D). Then, fine powders in the solution are deposited on the electrically conductive material. The resultant film of the fine powders applied to the substrate is fired to form a superconductor film (Step E). Finally, four leads are connected to the film for measuring the electrical resistance of the film (Step F).

EXAMPLE 1

As mentioned above, an inexpensive electrically conductive material is desirable for a cathode for the electrophoretic deposition of $YBa_2Cu_3O_{7-x}$. However, copper cannot be adopted because copper oxide is formed on the firing to deteriorate superconducting properties. However, copper can be used successfully in this Example.

Fine powders of yttrium oxide superconducting material of a composition of $YBa_2Cu_3O_{7-x}$ are prepared as follows:

First, powder materials of $Y_2O_3$, $BaCO_3$ and $CuO$ of good purity of all 99.99% are weighed so that a ratio of constituent elements Y, Ba and Cu should be 1:2:3. Then, the powder materials are mixed well and are fired in air at 900° C. for five hours to synthesize an oxide. The resultant oxide is crushed into powders, and the powders are mixed well and they are pressed at a pressure of 1500 kg/cm² with a press machine into pellets of a diameter of 9 mm and a thickness of 1 mm. The pellets are fired in air at 950° C. for five hours and they are crushed again into fine powders, which are fired further in air at 950° C. for three hours. By screening the obtained fine powders with a sieve through meshes, fine powders to be used for electrophoresis are selected so as to have an average powder size of about 1 μm.

The fine powders of $YBa_2Cu_3O_{7-x}$ prepared in this way are also used in the following examples as a superconducting material for electrophoretic deposition.

Figure 2:
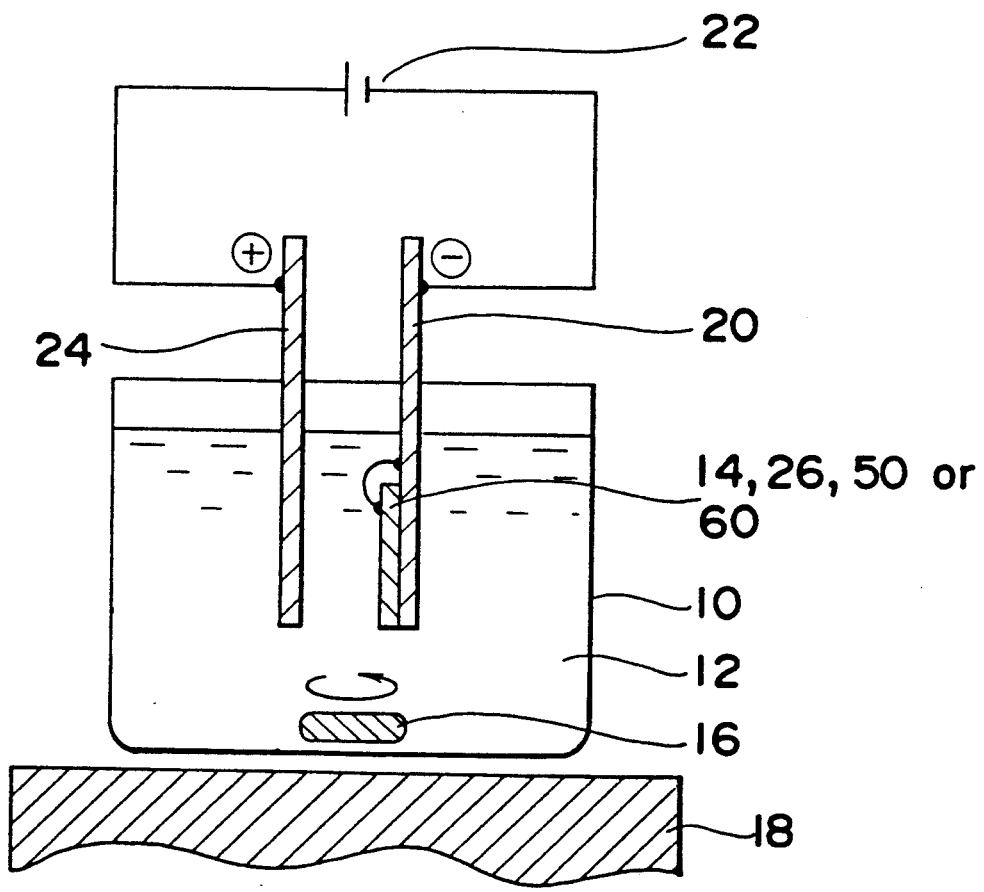
FIG. 2 is a schematic sectional view of an apparatus for manufacturing a film.

Fine powders of the yttrium oxide superconductor are next dispersed in acetone as an organic solvent put in a container 10, in a ratio of 2.5 g fine powders against 25 ml of acetone, and the obtained dispersion solution 12 is provided for electrophoretic deposition as shown in FIG. 2.

A dispersion solution 12 to be provided for the following Examples are also prepared similarly. However, the concentration of the fine powders is different in some Examples from that of this Example.

A substrate 14, on which a superconducting film should be deposited, is made of copper.

As shown in a schematic sectional view of FIG. 2 of an electrophoretic deposition apparatus of fine powders, the solution 12 prepared as explained above is put in the container 10, with a magnet 16 so as to disperse fine powders homogeneously with a magnetic stirrer 18.

On the other hand, the substrate 14 is first put on a electrically conductive electrode 20 being connected electrically to the substrate 14, and then it is immersed in the solution 12 and the electrode 20 is connected to the negative terminal of an external constant direct-voltage power source 22. The positive terminal of the power source 22 is connected to another electrode power counter electrode 24, which is arranged in the solution 12, opposite to the plane of the substrate 14. Then, the magnetic stirrer 18 is operated to disperse the fine powders homogeneously.

Next, an electric field of 200 V/cm is applied for about 10 minutes between the two electrodes 20 and 24, so that fine powders dispersed in acetone are deposited on the copper (electrically conductive surface) of the substrate 14 with electrophoretic deposition. Then, the substrate 14 with the deposited powders is heated in air at 900° C. for ten minutes, and subsequently cooled to and kept at 450° C. for five hours in order to control the oxygen ratio, and then it is cooled down to room temperature. The superconducting film manufactured in this way has a thickness of about 100 μm.

The temperature dependence of the electrical resistance of the film is measured by using the conventional four-probe method by forming titanium as voltage and current electrodes on the superconductor with the vacuum deposition technique and by connecting leads to the electrodes with silver paste. The electrical current value through the sample is 0.1 mA.

Figure 3:
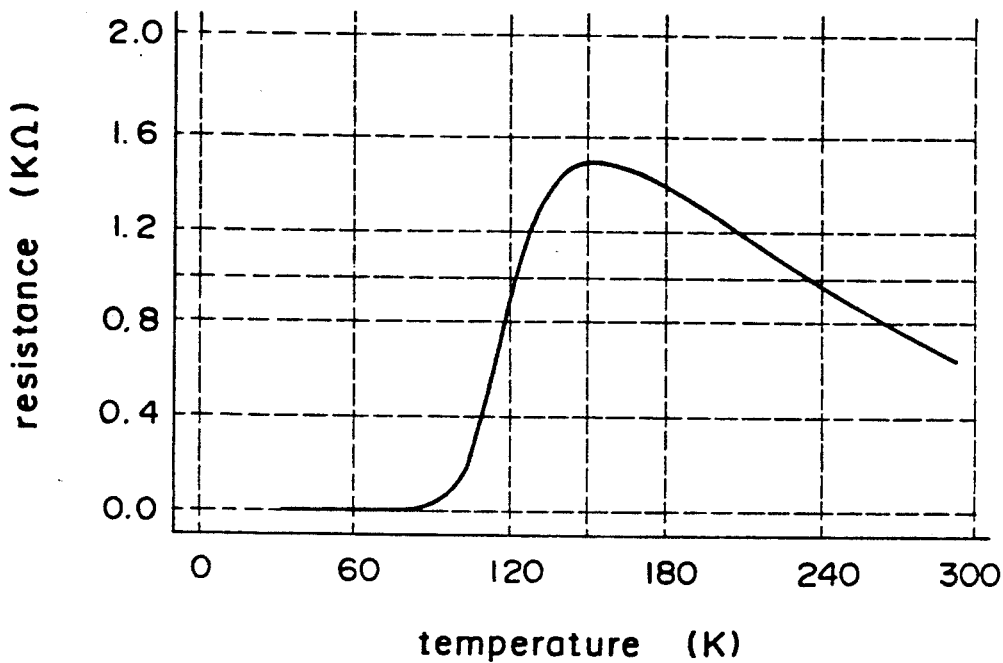
FIG. 3 is a graph of the temperature dependence of the electrical resistance of an oxide superconductor film according to Example 1.

FIG. 3 shows the resistance value plotted against temperature. It is found that the electrical resistance of the film manufactured as explained above starts to decrease at 150 K and becomes zero at 81 K.

FIG. 4 shows X-ray diffraction spectra of the manufactured film. The spectra prove that the film includes $YBa_2Cu_3O_{7-x}$ (90 K phase) partially. On the other hand, the electrical resistance value of the film in the normally conducting state is rather large, and it is ascribable to the sintering of the fine particles which constitute the film is performed partially.

EXAMPLE 2

An oxide film of fine powders is deposited on a copper substrate 14 in the same way as in case of Example 1. Then, the film is heated at 900° C. for one hour, and subsequently at 450° C. for one hour, and then it is cooled down.

Figure 5:
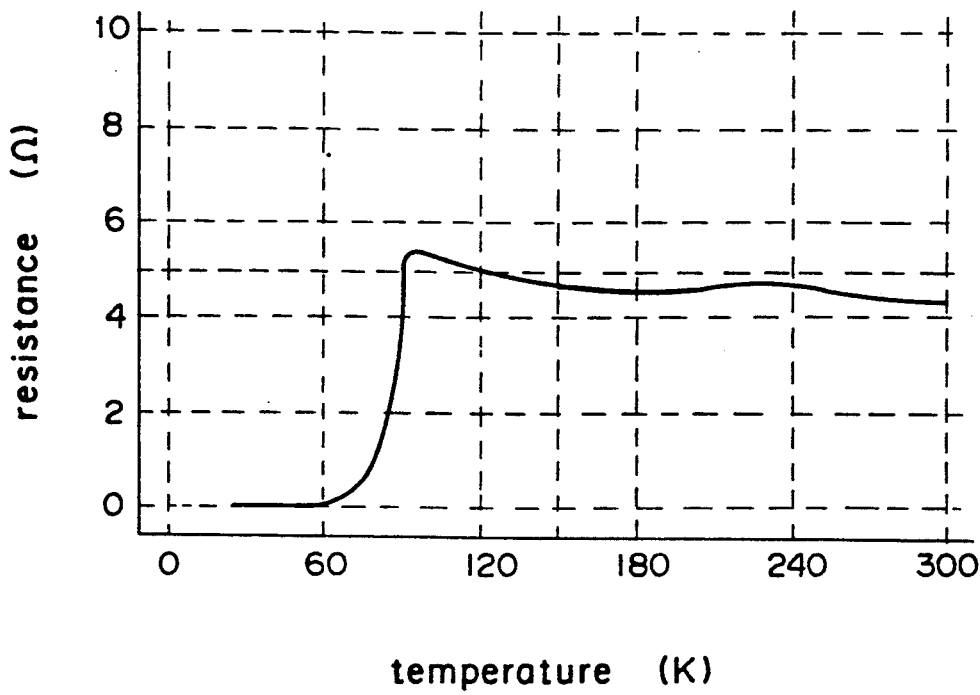
FIG. 5 is a graph of the temperature dependence of the electrical resistance of an oxide superconductor film according to Example 2.

FIG. 5 shows the temperature dependence of the electrical resistance of the film manufactured in this way. It is found that the electrical resistance of the film starts to decrease at 93 K and becomes zero at 58 K.

Figure 6:
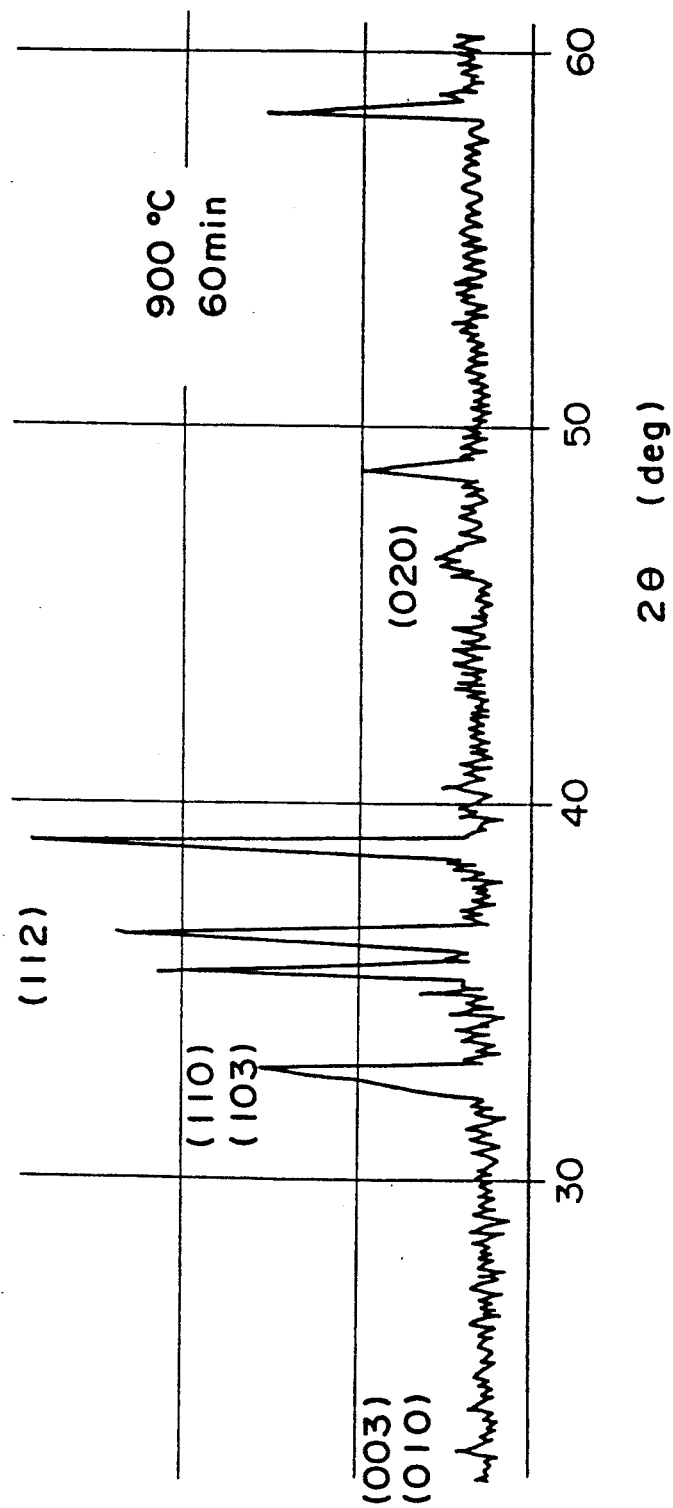
FIG. 6 is an X-ray diffraction spectra of an oxide superconductor according to Example 2.

FIG. 6 shows X-ray diffraction spectra of the film manufactured in this way. The spectra prove that $YBa_2Cu_3O_{7-x}$ (90 K phase) is made partially. The electrical resistance value of the film in the normally conducting state is low, and it is considered that the sintering of the fine powders which constitute the film, is performed enough. However, it is thought that a CuO layer is formed at the interface between the film and the copper substrate to make the superconducting properties of the file worse.

Examples 1 and 2 show that a superconducting film can be manufactured by using copper as a substrate for the electrophoretic deposition and that the superconducting characteristics can be controlled by the firing conditions.

The conditions of the manufacturing method of superconductor film are not limited to those of the above-mentioned Examples. The deposition conditions of superconductor fine powders such as the magnitude of the electric field between the electrodes, the concentration of fine powders in the solution or the deposition time can be controlled according to the specifications of a device which includes a superconductor film to be manufactured. The fine powders of superconductor to be used can also be prepared, for example, with the codeposition technique or the spray pyrolysis technique, other than the solid reaction technique used in the above Examples. The kind of superconductor is not limited to Y—Ba—Cu—O system, but an oxide (ceramic) superconductor such as Bi—Sr—Ca—Cu—O system, Tl—Ba—Ca—Cu—O system or Nd—Ce—Cu—O system can also be used. Furthermore, a compound superconductor based upon Nb, V or the like, can also be used and if the surface of fine powder film is processed to have the Josephson effect, the same effect can be realized as the grain boundary characteristics of the oxide superconductors. Other organic liquid than acetone, such as methyl ketone or nitromethane, can be used as a solvent for the fine powders. The insulating substrate can be made of MgO, $SrTiO_3$ as well as YSZ. The insulating substrate may not necessarily be a flat plate.

Further, any substrate on which a copper thin film is formed by deposition, plating or the like can also be used instead of the substrate 14 made of copper plate.

EXAMPLE 3 (COMPARISON EXAMPLE)

A film is manufactured by using the same manufacturing method as in case of Example 1, except that a substrate 14 is made of tungsten or stainless steel. The 900° C. firing is performed and the electrical resistance is measured. However, it is found that the superconducting state is not realized and the electrical resistance becomes very large.

As mentioned above, a superconductor film manufactured by using the electrophoretic deposition cannot be processed by the patterning technique (e.g. photoetching process) because the grain boundary characteristics are deteriorated. In the following Examples, new manufacturing methods of a superconducting device having a minute pattern will be disclosed.

EXAMPLE 4

Figure 7:
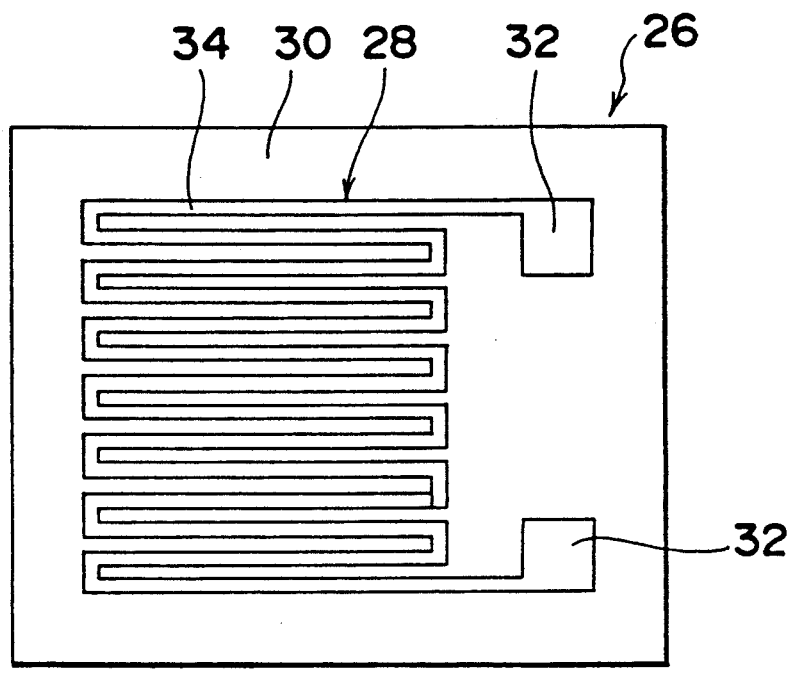
FIG. 7 is a schematic plan view of a substrate according to Example 4.

A substrate 26 used for electrophoretic deposition is shown schematically in FIG. 7, wherein an electrically conductive electrode 28 of silver thin film is formed on an insulating substrate 30 of yttrium stabilized zirconia (YSZ). A silver thin film is deposited first on the YSZ substrate 30 by using the vacuum deposition technique with electron beam heating, and the silver thin film is processed by the patterning with the lift-off technique to form the electrode 28 having a minute pattern.

The electrode 28 comprises two pads 32 and a narrow line 34 connecting both pads 32, and the line 34 is arranged so that its direction turns alternately many times; the width of the line 34 and the spacing between the linear parts of the line 34 are both set to be 50 $\mu$m. Thus, the electrode 28 has a minute pattern.

The dispersion solution 12 of $YBa_2C_3O_{7-x}$ fine powders is prepared as explained in Example 1, except that the concentration of fine powders is 1.0 g against acetone 25 ml.

A film is deposited on the substrate 26 by using the apparatus shown in FIG. 2. By applying an electrical field of 200 V/cm between the electrode 26 fixed to the electrode 20 and the counter electrode 24 for one minute, a film of fine powders is deposited on the substrate 26 according to the pattern of the electrode 28. The substrate 26 is heated at 900° C. during ten minutes and subsequently kept at 450° C. for five hours, and then it is cooled down to room temperature. The thickness of the resultant superconductor film 34 is about 10 $\mu$m.

Figure 8:
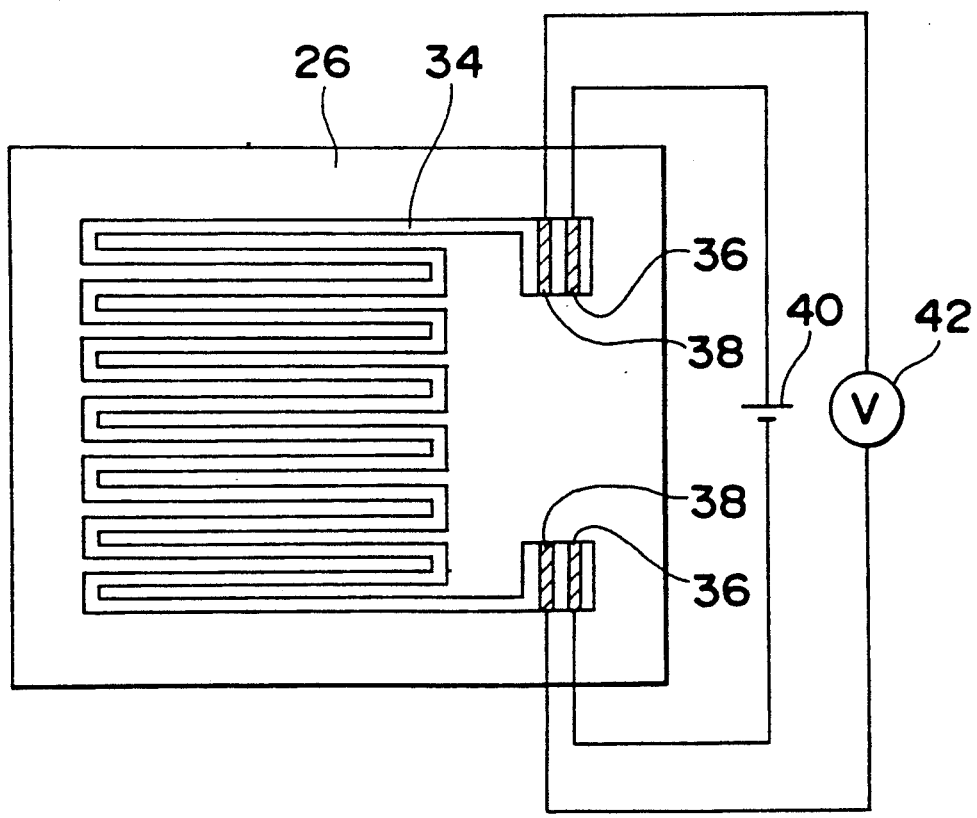
FIG. 8 is a schematic plan view of a magnetic sensor according to Example 4.

FIG. 8 shows the superconductor film 34 on the substrate 26 schematically. Then, titanium current electrodes 36 and voltage ones 38 are formed on the superconductor applied to the pads 32 with the vacuum deposition technique, and titanium adheres well with the superconductor. Then, a constant current source 40 and a voltmeter 42 are connected between the current electrodes 36 and between the voltage electrodes 38, respectively, by adhering leads with silver paste.

Figure 9:
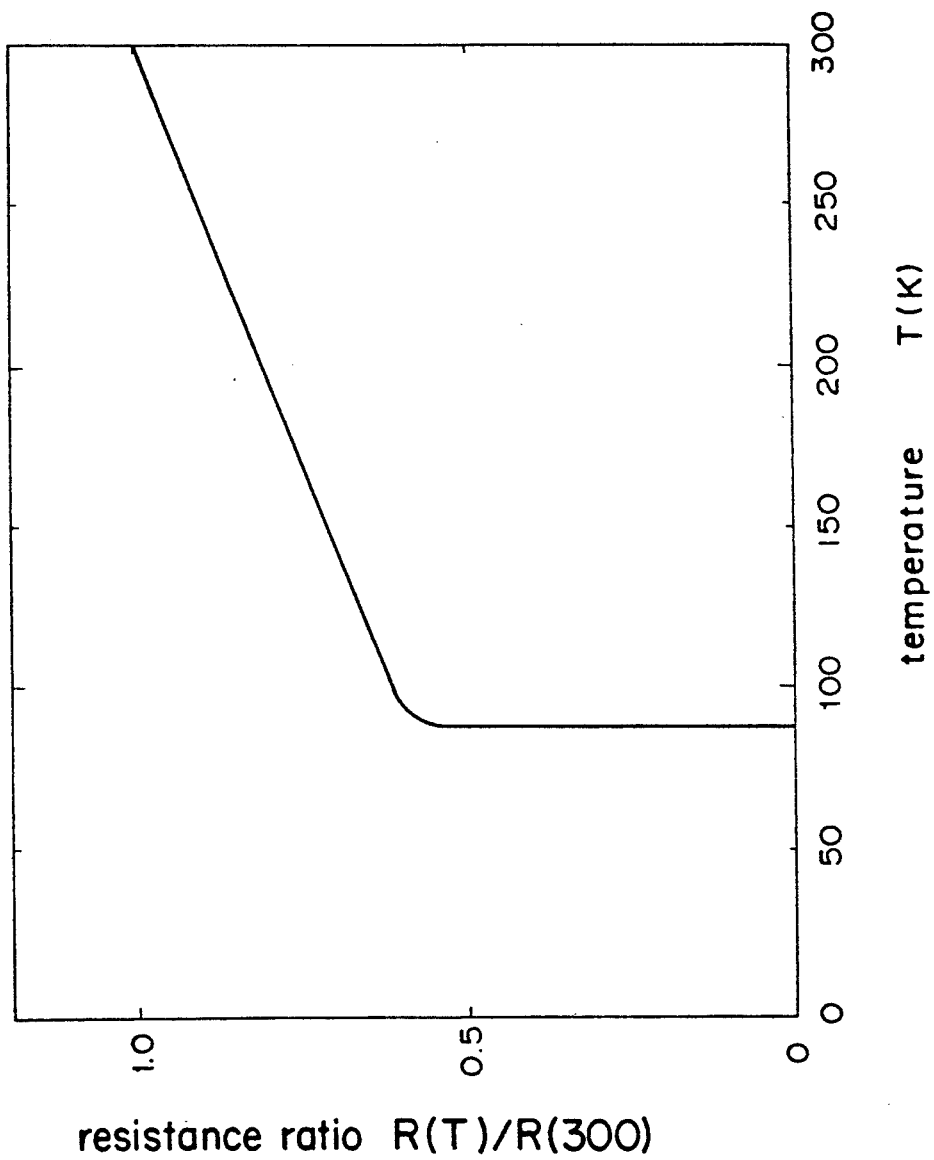
FIG. 9 is a graph of the temperature dependence of the resistance ratio of an oxide superconductor film according to Example 4.

FIG. 9 shows the temperature dependence of the electrical resistance of a magnetic sensor obtained as mentioned above, which is measured with the conventional four-probe method. The electrical resistance R(T) at a temperature T normalized by that at 300 K, R(300), is plotted against temperature T.

It is apparent from FIG. 9, that the electrical resistance value of the superconducting film becomes zero at 87 K.

Further, it is found that the superconductor film 34, which is manufactured by depositing superconductor fine powders dispersed in an organic solvent on an electrode under a negative bias voltage, is formed to have the same pattern as the electrically conductive thin film 28 formed beforehand on the YSZ substrate 30. Thus, it is confirmed that this manufacturing method is suitable for manufacturing a device having a minute and precise pattern of oxide superconductor with grain boundaries. That is, an oxide superconductor film having the grain boundary effect can be manufactured easily.

EXAMPLE 5

A superconducting patterned film is manufactured in the same method as that of Example 4, except that platinum is used as a material of an electrically conductive electrode 28 to be applied to an insulating substrate 30. The Pt electrode 28 is formed by the patterning of a Pt thin film deposited on the YSZ substrate 30 with the sputtering technique by using the lift-off technique.

The temperature dependence of the electrical resistance of the obtained superconductor film is measured with the method explained above in Example 4, and it is confirmed that the electrical resistance becomes zero at 85 K.

The conditions of the manufacturing method of superconductor film of Examples 4 and 5 can be changed similarly to the method of Example 1, as mentioned above after Example 2. Furthermore, the pattern of the electrode 28 may be changed according to the specification of a device. Other metals, such as aluminum can be used as a material for the electrode 28. Copper can also be used as a material for the electrode 28, but the firing should be performed in the conditions that the fine powders are sintered partially, as in Example 1.

EXAMPLE 6

A superconducting patterned film is manufactured in the same method as that of Example 4, except that an electrically conductive electrode 28 applied to an insulating substrate 30 is made of copper. The electrode 28 is formed by using the vacuum deposition technique of a copper film and the patterning with the lift-off technique. The electrical resistance of the obtained superconductor oxide film manufactured in this way begins to decrease at 87 K and becomes zero at 35 K. In other words, the superconducting properties of this Example are inferior to those of the preceding Examples 4 and 5.

EXAMPLE 7

$YBa_2Cu_3O_{7-x}$ fine powders prepared as mentioned in Example 1, are dispersed in acetone as an organic solvent. The concentration of the fine powders in the dispersion solution is 1.0 g against 25 ml acetone.

Figure 10:
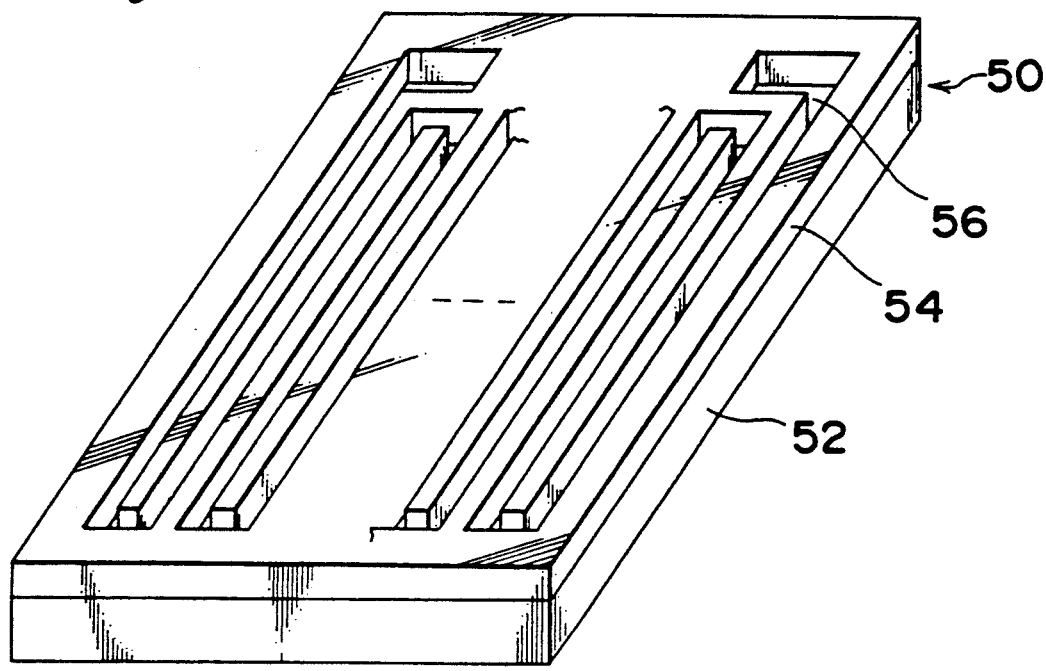
FIG. 10 is a schematic perspective view of a substrate according to Example 7.

FIG. 10 shows a substrate 50 on which fine powders should be deposited. The substrate 50 comprises a copper plate 52 and a silicon oxide film 54 formed on the copper plate 52. The silicon oxide film 54 is first formed on the copper plate 52, with the ion plating technique and then an aperture (groove) 56 is formed in the film 54 by using the patterning with the lift-off technique.

The pattern of the aperture 56 has linear segments turning alternately, similarly to the narrow line 24 of substrate 26. The width of the linear segments of the aperture 56 and the distance between neighboring linear segments are both set to be 50 $\mu$m.

The substrate 50 is fixed to the negative electrode 20 in an electrophoresis apparatus shown in FIG. 2 and 200 V/cm of electric field is applied between the negative electrode 20 and the positive copper electrode 24 for one minute, so that a film consisting of ceramic superconductor fine powders is deposited on the copper plate 50 in the aperture 56 of the silicon oxide film 54.

The substrate 50 with the deposited powders is heated in air at 900° C. for ten minutes, as in case of Example 1, and subsequently kept at 450° C. for five hours to control the oxygen ratio and then it is cooled down to room temperature. The superconducting film thus prepared has a thickness of about 10 $\mu$m.

Figure 11:
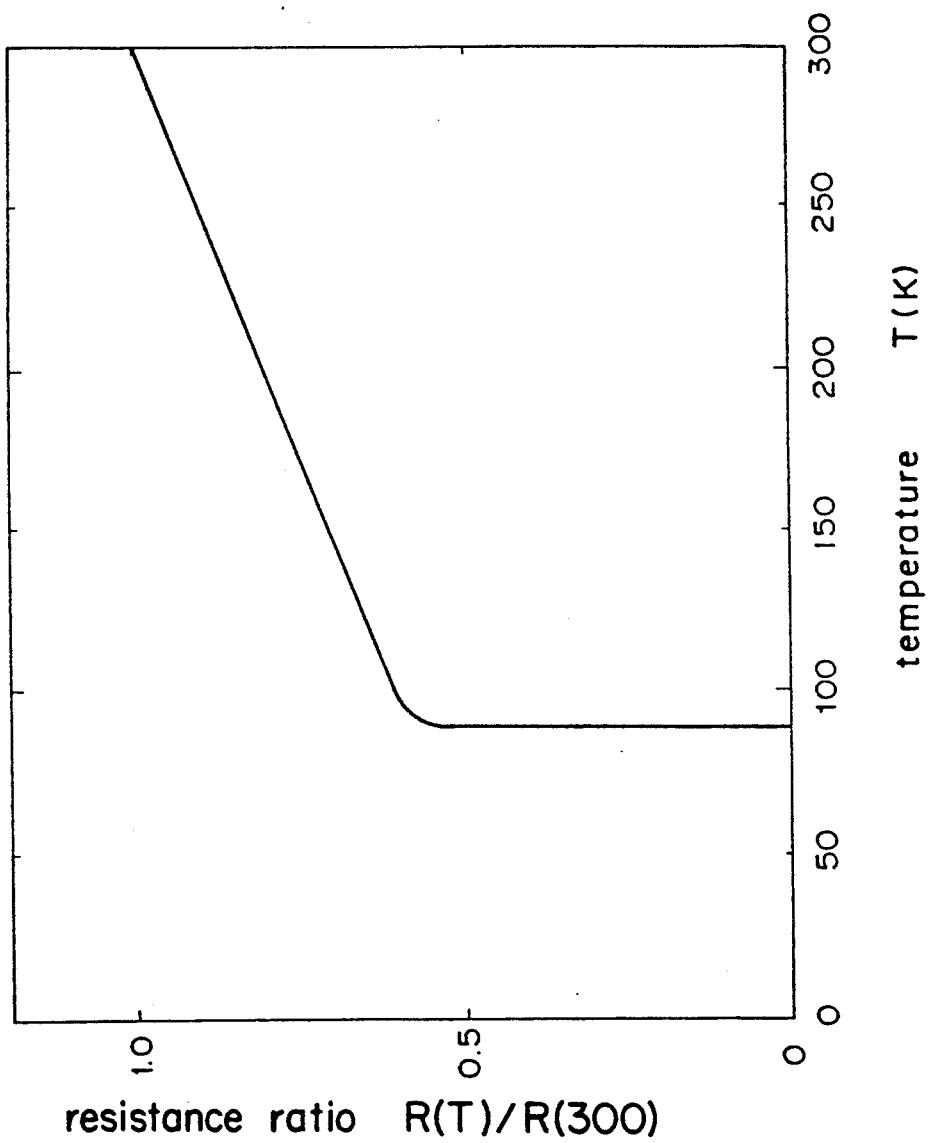
FIG. 11 is a graph of the temperature dependence of the resistance ratio of an oxide superconductor film according to Example 7.

FIG. 11 shows the temperature dependence of electrical resistance of the superconducting film measured with the conventional four-probe method by forming titanium electrodes on the superconductor with vacuum deposition and by connecting leads with silver paste. An electric current of 10 mA is flowed through the superconductor film during the measurement.

As shown in FIG. 11, it is found that the superconductor film thus manufactured has a good characteristic that the electrical resistance becomes zero at 87 K.

EXAMPLE 8

Figure 12:
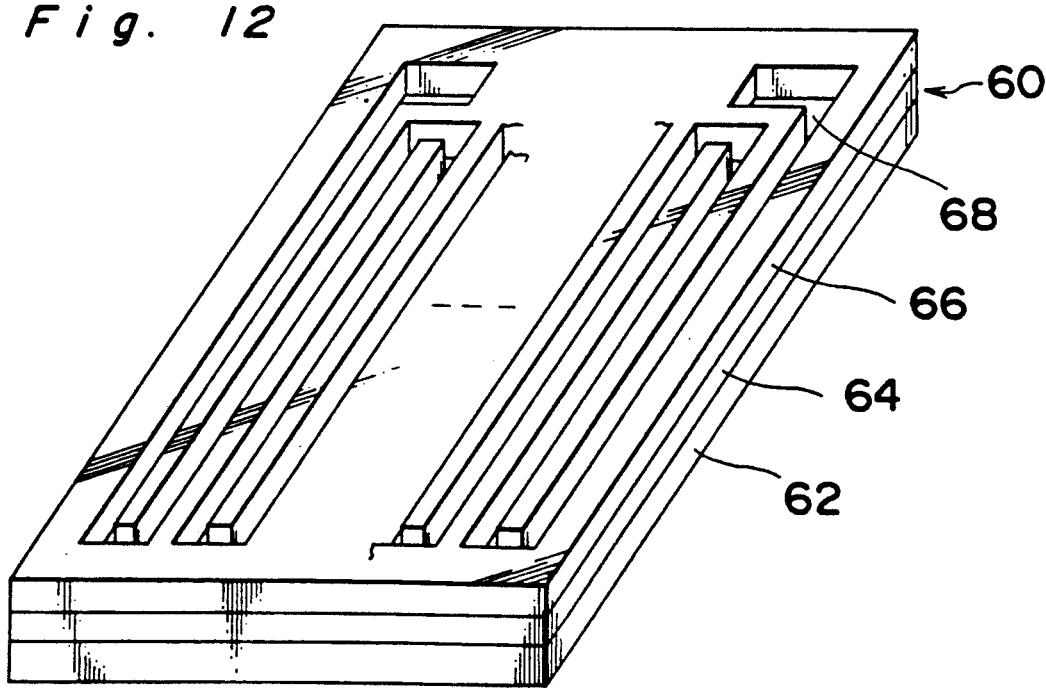
FIG. 12 is a schematic perspective view of a substrate according to Example 8.

This Example shown in FIG. 12 is the same as Example 7, except that a substrate 60 is an electrically conductive substrate comprising an insulating substrate 62 of yttrium stabilized zirconia (YSZ) and a copper thin film 64 applied to the insulating substrate 62 with the electron beam deposition technique. Then, a silicon oxide film 66 is similarly applied to the copper thin film 64 with the ion plating technique, and an aperture 68 is formed in the film 66 by using the patterning with the lift-off technique. By using the substrate 60, the deposition of a film due to electrophoresis and the firing treatment of the obtained superconductor film are performed under the same conditions as in Example 7.

It is found that the temperature dependence of the electrical resistance of the film of this Example is the same as that of the film of Example 7, and the critical temperature at which the electrical resistance becomes zero is 87 K.

The films prepared in Examples 7 and 8 are found to have a precise pattern, following exactly the pattern of the aperture 68, formed on the electrically conductive substrate. The pattern of aperture 68 of the insulating film 66 can be formed precisely relatively easily, and the restrictions on the patterning are not serious. Therefore, any pattern of ceramic superconductor film can be formed precisely.

The conditions of the manufacturing method of oxide superconductor film of Examples 7 and 8 can be changed similarly as mentioned below Example 2. Further, though the copper film 62 of Examples 7 and 8 is made of copper as an electrically conductive material, the film 62 can also be made of a material such as aluminum or silver, and the substrate 62 may be made of an insulator such as MgO or $SrTiO_3$.

EXAMPLE 9

Fine powders of $YBa_2Cu_3O_{7-x}$, prepared as mentioned in Example 1, are dispersed in acetone as an organic solvent and the concentration of the fine powders in the dispersion solution is 1.0 g against 25 ml acetone.

Figure 13:
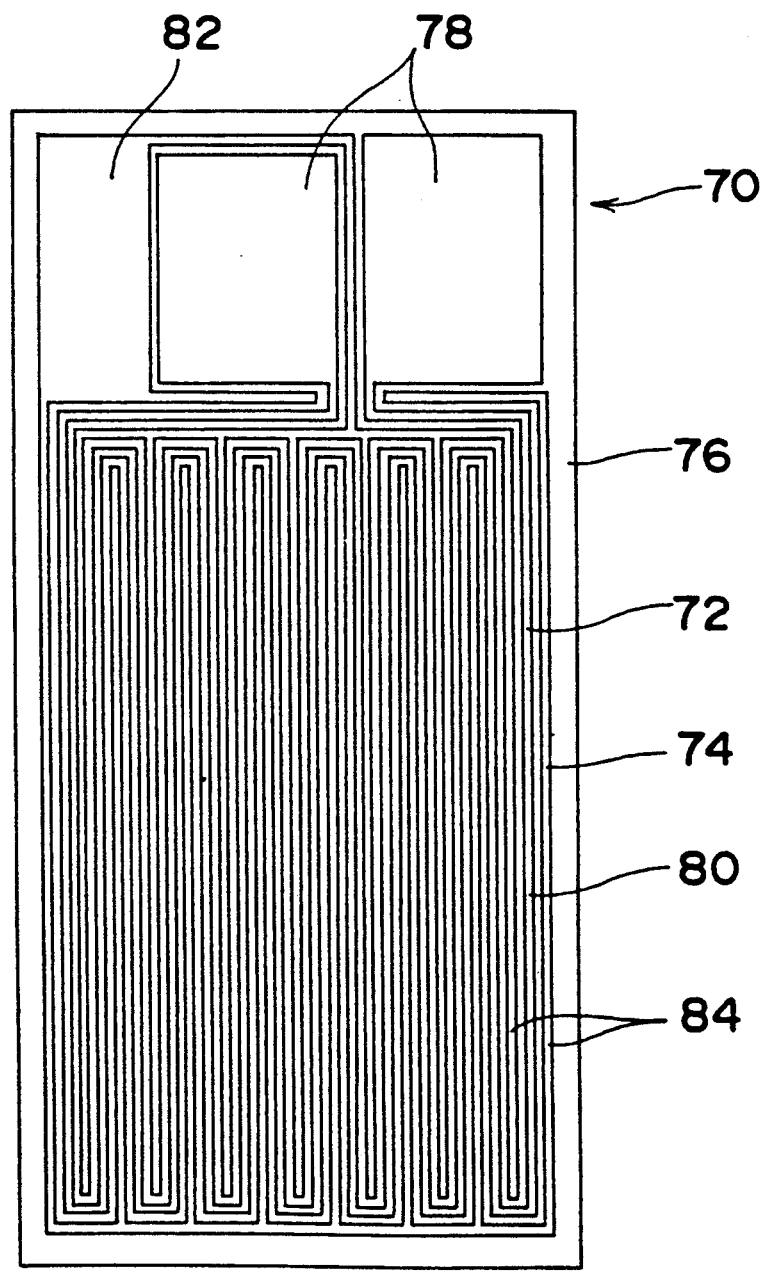
FIG. 13 is a schematic plan view of a substrate according to Example 9.

FIG. 13 shows a substrate 70 for applying a superconductor film characterized in having two electrically conductive thin films 72, 74. That is, the substrate 70 comprises an insulating substrate 76 of yttrium stabilized zirconia (YSZ), an electrically conductive thin film electrode 72 of silver, having a pattern of the shape of a superconductor thin film to be manufactured, to be deposited formed on a surface of the insulating substrate 76, and another electrically conductive thin film electrode 74, formed on the same surface near the former electrode 72, so as to keep a constant spacing between both electrodes 72 and 74.

The electrodes 72 and 74 are formed by the patterning of a silver thin film which is deposited on the substrate 76 with the vacuum deposition technique with use of electron beam heating with the lift-off technique. The former electrode 72 comprises two pads 78 and a narrow line 80 connecting the two pads 78. The narrow line 80 is arranged for its direction to turn alternately as the line 34 displayed in FIG. 6. On the other hand, the latter electrode 74 is arranged so as to enclose the former electrode 72 by keeping a constant spacing; the latter electrode 74 comprises a pad 82 and a line 84 connected to the pad 82. The width of the lines 80 and 84 and the distance between them are all set to be 50 μm to form a minute pattern.

Figure 14:
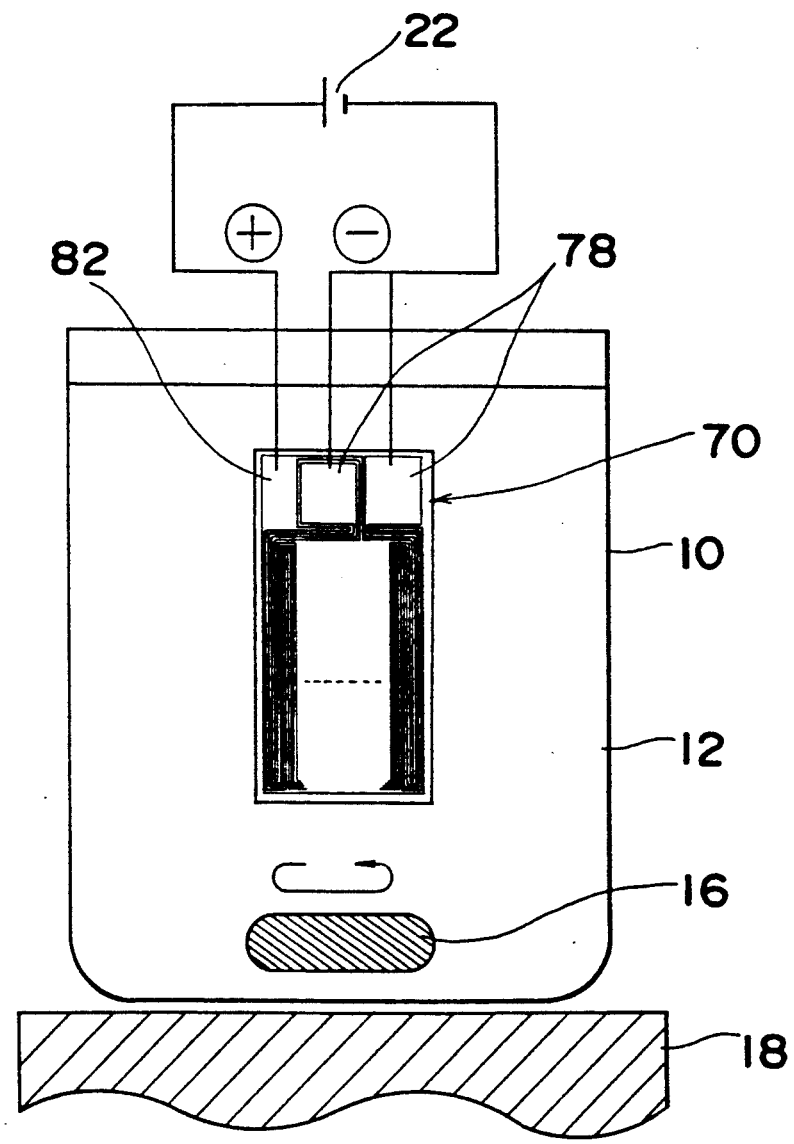
FIG. 14 is a schematic sectional view of an apparatus for manufacturing a film.

As shown in FIG. 14, the substrate 70 is put in the dispersion solution 12. A difference with the set-up shown in FIG. 2 is that the electrode pads 78 are connected to the negative terminal of the external constant voltage source 22 while the electrode pad 82 is connected to the positive terminal. A counter electrode 24 is not used.

Then, an electric voltage of 100 V is applied through the electric pads 78 and 82 between the electrodes 72 and 74 of the substrate 70 for five minutes, so that the fine powders dispersed in the solution 12 are deposited on the electrode 72 with the electrophoretic deposition technique. The deposited film on the substrate 70 is heated in air at 900° C. for one hour for sintering, next at 450° C. for three hours for the control of oxygen ratio, and then cooled down to room temperature.

The thickness of the superconducting film manufactured in this way is about 10 μm, and it is found that the film is formed more precisely according to the pattern of the electrode 72 than that of Example 1.

After forming titanium thin film electrodes on the superconductor applied to the pads 76 with the vacuum deposition technique and connecting leads to the titanium electrodes with silver paste, the temperature dependence of the electrical resistance of the film is measured with the conventional four-probe method.

Figure 15:
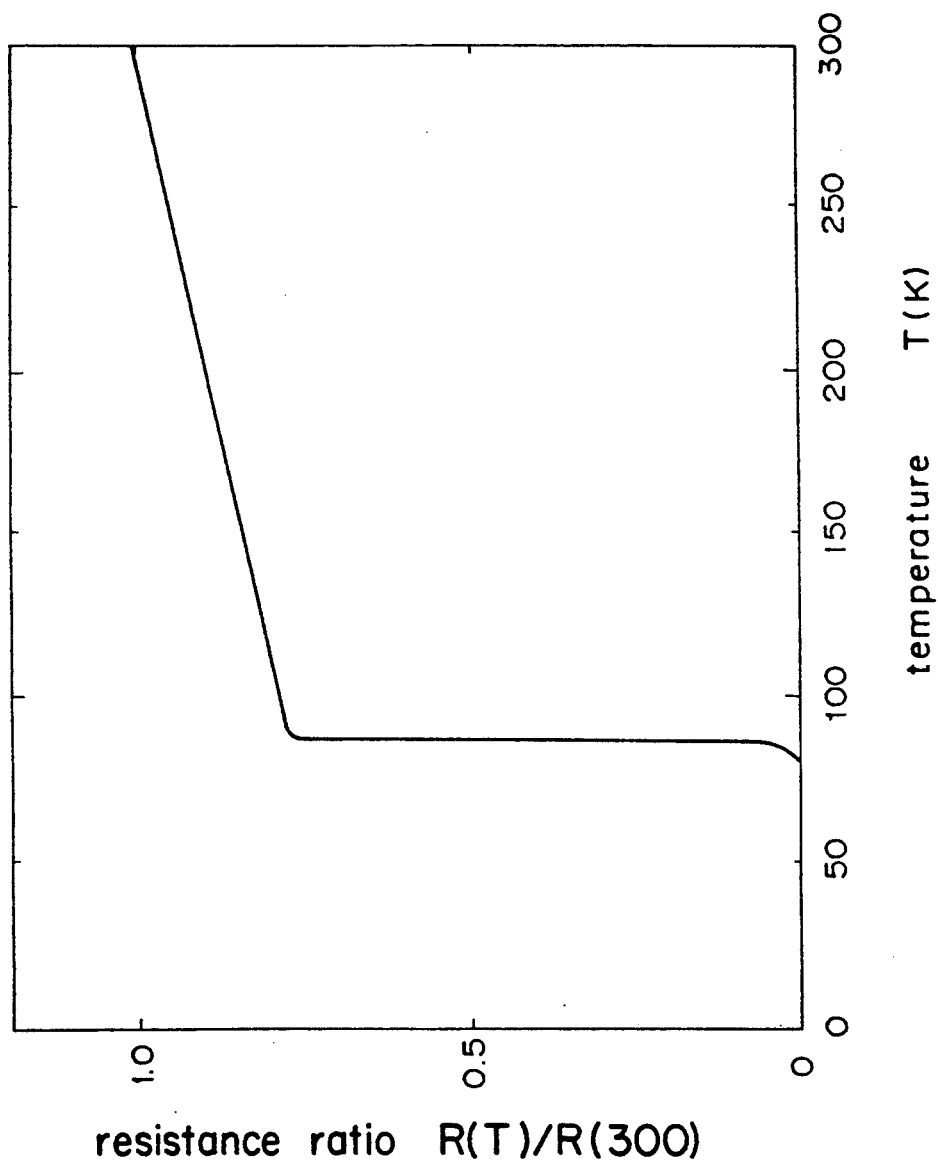
FIG. 15 is a graph of the temperature dependence of the resistance ratio of an oxide superconductor film according to Example 9.

FIG. 15 shows the data, wherein the abscissa designates the absolute temperature (K), while the ordinate a ratio of a resistance value at each temperature to that at 300 K, R(300). It is clear, that a superconducting film has a good characteristic that the electrical resistance becomes zero at 80 K.

It is found in previous Examples that the pattern of the superconducting thin film does not follow the pattern of the electrode 72 and it has disorder at the edge of the pattern. This is ascribable to the generation of a round-about electrical field, because the electric voltage gradient around the electrode 72 becomes small, even if a rather high electric voltage is applied between the electrodes 72 and 24. Fine powders are deposited according to the round-about electrical field makes the pattern vague. On the contrary, in this Example 9, an electric voltage is applied between the electrodes 72 and 74 which are arranged closely to each other on the same substrate 76, and the applied electric field generates a large electric field concentrated around the electrode 72. Thus, the electric field is not disturbed near the electrode 72. It is confirmed in this Example that the substrate 70 is appropriate for the formation of a more precise pattern of superconducting film.

In this Example, the thin film electrode 72 for forming a superconducting film and the thin film electrode 74 formed around the former electrode 72, for applying a positive voltage, are used for deposition. However, a counter electrode such as the electrode 24 displayed in FIG. 2 can also be used, if necessary, , according to the shape of a superconducting film to be formed. That is, a superconducting thin film can be manufactured by setting another copper counter-electrode 24 of positive electric voltage in the solution 12 as in FIG. 2 and applying a high voltage between the electrodes 26 and 24 to deposit fine powders with an electrophoretic deposition process.

The conditions of the manufacturing method of Example 9 can be changed similarly as in Example 1, as mentioned below Example 2.

The pattern of the electrode 72 can be changed according to the specification of a device to be manufactured.

Metals, other than silver, such as platinum or aluminum, can also be used for the electrodes 72 and 74. Copper can also be used for electrodes 72, 74 and in this case the firing is performed on the conditions that the fine powders deposited are sintered partially.

By applying the manufacturing methods according to these Examples, various kinds of minute patterns can be formed on the substrate, so that many kinds of devices, such as a magnetic sensor, a photo sensor or a logic device can be manufactured.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of manufacturing a device having a superconductor film having random grain boundaries that act as weak coupling comprising the steps of:
   (a) applying a film of electrically conductive material onto an electrically insulating substrate;
   (b) forming a pattern of the film with electron beam heating;
   (c) dispersing fine powders of a superconductor material in an organic solvent to form a dispersion solution;
   (d) immersing the substrate and a counter electrode in the dispersion solution;
   (e) applying an electric voltage between the pattern of the film applied to the substrate and the counter electrode so as to keep the electric potential of the pattern negative compared with that of the counter electrode, whereby fine powders in the dispersion solution are deposited on the pattern; and
   (f) firing the fine powders deposited on the pattern to form a superconductive material with weak grain boundaries that act as weak coupling.

2. A method according to claim 6, wherein said superconductor material is $YBa_2Cu_3O_{7-x}$ compound.

3. A method according to claim 2, further comprising the step of heating the fine powders in order to control the oxygen ratio after the firing step.

4. The method according to claim 2, wherein said powders have an average powder size of about $1\mu$.

5. A method according to claim 1, wherein said film applied to said electrically insulating substrate is made of silver.

6. A method according to claim 1, wherein said film applied to said electrically insulating substrate is made of platinum.

7. A method for manufacturing a device having a superconductor film comprising the steps of:
   (a) applying a film of electrically insulating material to an electrically conductive substrate;
   (b) forming a pattern of the film;
   (c) dispersing fine powders of a superconductor material in an organic solvent to form a dispersion solution;
   (d) immersing the electrically conductive substrate and counter electrode in the dispersion solution;
   (e) applying an electric voltage between the electrically conductive substrate and the counter electrode so as to keep the electric potential of the electrically conductive substrate negative compared with that of the counter electrode, whereby fine powders in the dispersion solution are deposited on the predetermined surface area of the electrode not covered by the electrically insulating material; and
   (f) firing the fine powders deposited on the surface area.

8. A method according to claim 7, wherein said superconductor material is $YBa_2Cu_3O_{7-x}$ compound.

9. A method according to claim 8, further comprising the step of heating the fine powders in order to control the oxygen ratio after the firing step.

10. A method according to claim 7, wherein said electrically conductive substrate is made of copper, and said firing is performed in the conditions that the fine powders are sintered partially.

11. A method according to claim 7, wherein said electrically conductive substrate comprises an electrically insulating substrate and a copper thin film applied to the electrically insulating substrate, and said firing is performed in the conditions that the fine powders are sintered partially.

12. A method for manufacturing a device having a superconductor film comprising the steps of:
   (a) forming a first pattern and a second pattern both of a film of electrically conductive material applied to an electrically insulating substrate, the first pattern having a shape of superconductor film to be manufactured, the second pattern being formed near the first pattern with a constant distance;
   (b) dispersing fine powders of a superconductor material in an organic solvent to form a dispersion solution;
   (c) immersing the substrate in the dispersion solution;
   (d) applying an electric voltage between the two patterns on the substrate, so as to keep the electric potential of the first pattern negative compared with that of the second pattern, whereby fine powders in the dispersion solution are deposited o the first pattern; and
   (e) firing the fine powders deposited on the first pattern.

13. A method according to claim 12, wherein said superconductor material is $YBa_2Cu_3O_{7-x}$ compound.

14. A method according to claim 13, further comprising the step of heating the fine powder in order to control the oxygen ratio after the firing step.

15. A method according to claim 12, wherein said second pattern is arranged to keep a constant spacing with said first pattern.

16. A method according to claim 12, wherein said first and second patterns of said film is made of silver.

17. A method according to claim 12, wherein a counter electrode is immersed in the dispersion solution, and an electric voltage is also applied between the counter electrode and the first pattern of the substrate so as to keep the electric potential of the first pattern negative compared with that of the counter electrode.

18. A method for manufacturing a device having a superconductor film having random grain boundaries which act as weak coupling comprising the steps of:
   (a) applying a film of electrically conductive material onto an electrically insulating substrate;

(b) forming a pattern of the film with electron beam heating;

(c) dispersing fine powders of a superconductor material in an organic solvent to form a dispersion solution;

(c) immersing the substrate and a counter electrode in the dispersion solution;

(d) applying an electric voltage between the pattern of the film applied to the substrate and the counter electrode so as to keep the electric potential of the pattern negative compared with that of the counter electrode, whereby fine powders in the dispersion solution are deposited on the pattern; and firing the fine powders deposited on the pattern.

19. A method according to claim 18, wherein said superconductor material is $YBa_2Cu_3O_{7-x}$ compound.

20. A method according to claim 19, further comprising the step of heating the fine powders in order to control the oxygen ratio after the firing step.

21. The method according to claim 4, wherein said powders have an average powder size of about $1\mu$.

22. A method for manufacturing a device having a superconductor film having random grain boundaries that act as weak couplings comprising the steps of:

(a) applying a film of electrically insulating material to an electrically conductive substrate;

(b) forming a pattern of the film;

(c) dispersing fine powders of a superconductor material in an organic solvent to form a dispersion solution;

(d) immersing the electrically conductive substrate and a counter electrode in the dispersion solution;

(e) applying an electric voltage between the electrically conductive substrate and the counter electrode so as to keep the electric potential of the electrically conductive substrate negative compare with that of the counter electrode, whereby fine powders in the dispersion solution are deposited on the predetermined surface area of the electrode not covered by the electrically insulating material; and (f) firing the fine powders deposited on the surface area.

23. A method according to claim 22, wherein said superconductor material is $YBa_2Cu_3O_{7-x}$ compound.

24. A method for manufacturing a device having a superconductor film having grain boundaries that act as weak couplings comprising the steps of:

(a) forming a first pattern and a second pattern both of a film of electrically conductive material applied to an electrically insulating substrate, the first pattern having a shape of superconductor film to be manufactured, the second pattern being formed near the first pattern with a constant distance;

(b) dispersing fine powders of a superconductor material in an organic solvent to form a dispersion solution;

(c) immersing the substrate in the dispersion solution;

(d) applying an electric voltage between the two patterns on the substrate, so as to keep the electric potential of the first pattern negative compared with that of the second electrode, whereby fine powders in the dispersion solution are deposited on the first pattern; and (e) firing the fine powders deposited on the first pattern.

25. A method according to claim 24, wherein said superconductor material is $YBa_2Cu_3O_{7-x}$ compound.

* * * * *